(12) United States Patent
Fan et al.

(10) Patent No.: US 6,827,247 B1
(45) Date of Patent: Dec. 7, 2004

(54) APPARATUS FOR DETECTING THE OSCILLATION AMPLITUDE OF AN OSCILLATING OBJECT

(75) Inventors: Liming Fan, Singapore (SG); Hon Yu Peter Ng, Singapore (SG); Xianbin Zhu, Singapore (SG); Yam Mo Wong, Singapore (SG); Keng Yew Song, Singapore (SG)

(73) Assignee: ASM Technology Singapore PTE Ltd. (SG)

( * ) Notice: Subject to any disclaimer, the term of this patent is extended or adjusted under 35 U.S.C. 154(b) by 0 days.

(21) Appl. No.: 09/913,014
(22) PCT Filed: Dec. 8, 1999
(86) PCT No.: PCT/SG99/00139
§ 371 (c)(1),
(2), (4) Date: Aug. 8, 2001
(87) PCT Pub. No.: WO01/73373
PCT Pub. Date: Oct. 4, 2001
(51) Int. Cl.⁷ .......................... B23K 5/20; B23K 20/08; B23K 1/06; B23K 31/12
(52) U.S. Cl. ...................... 228/1.1; 228/4.5; 228/102; 228/103; 228/110.1; 228/180.5; 356/28.5
(58) Field of Search .............................. 228/1.1, 110.1, 228/4.5, 180.5, 102, 103; 356/502, 358, 28.5

(56) References Cited

U.S. PATENT DOCUMENTS 3,800,893 A * 4/1974 Ramsay et al. .......... 177/25.14
4,854,494 A * 8/1989 von Raben ................. 228/1.1
5,101,599 A    4/1992 Takabayasi et al. ............. 51/59
5,199,630 A * 4/1993 Felber et al. ............... 228/102
5,431,324 A * 7/1995 Kajiwara et al. ............ 228/1.1
5,623,307 A * 4/1997 Kotidis et al. .............. 356/493
5,734,108 A * 3/1998 Walker et al. ............... 73/650
6,181,431 B1 * 1/2001 Siu ........................... 356/502
6,279,248 B1 * 8/2001 Walters ....................... 33/784
6,285,514 B1 * 9/2001 O'Meara et al. ............ 359/721
6,323,943 B1 * 11/2001 Maruyama et al. ........ 356/28.5
6,392,692 B1 * 5/2002 Monroe ..................... 348/143
6,424,407 B1 * 7/2002 Kinrot et al. ............... 345/166

FOREIGN PATENT DOCUMENTS

WO    WO 01/73373 A1 * 10/2001

* cited by examiner

Primary Examiner—L. Edmondson
(74) Attorney, Agent, or Firm—Ostrolenk, Faber, Gerb & Soffen LLP

(57) ABSTRACT

Apparatus for detecting the oscillation amplitude of an oscillating object (3) includes an optical radiation source (9) and a detector (10) including first and second optical radiation sensing areas (24A, 24B) adjacent each other. The detector (10) and the optical radiation source (9) are adapted to be located opposite each other with the oscillating object (3) located between the source (9) and the detector (10) so that the object (3) blocks a portion of the sensing areas (24A, 24B) from receiving optical radiation from the source (9). A processor (18) coupled to the detector (10) receives first and second output signals representing the magnitude of optical radiation sensed by the first and second optical radiation sensing areas (24A, 24B), respectively. The processor (18) processes the first and second output signals to obtain an indication of the amplitude of oscillation of the object (3).

27 Claims, 8 Drawing Sheets

DURING BONDING MEASUREMENT

FREE VIBRATION CALIBRATION

APPARATUS FOR DETECTING THE OSCILLATION AMPLITUDE OF AN OSCILLATING OBJECT

The invention relates to apparatus for detecting the oscillation amplitude of an oscillating object and in particular, the oscillation amplitude of the capillary tip of an ultrasonic transducer for ultrasonic welding.

During the semiconductor packaging process a semiconductor die (or chip) is bonded to a metal leadframe. This is commonly known as die attachment. Conductive wire is then bonded between electrical contact pads on the die and electrical contacts on the leadframe by a piece of equipment commonly known as a wire bonder. The wire bonder bonds the conductive wire to the die and the leadframe by an ultrasonic welding process, which uses an ultrasonic wave transducer. The ultrasonic wave transducer has a capillary working tip mounted on it and the conductive wire passes through a through bore in the capillary to the capillary tip. It is the tip, which applies the ultrasonic vibration from the transducer to the conductive wire to form the bond. The transducer generates longitudinal vibration of the capillary tip, which bonds the wire onto the die pad or the leadframe.

The oscillation amplitude of the capillary tip has been identified as one of the critical parameters necessary to achieve consistent bonding results. Due to the very small size of the capillary tip and the complex vibration pattern, it is difficult to accurately measure the vibration amplitude of the capillary tip in both free (unloaded) vibration mode and loaded vibration mode. A further complication is that different capillaries used in different transducers have different vibration patterns. A large number of attempts have been made in recent years to develop systems to measure the oscillation amplitude accurately.

However, these systems either can not perform real-time measurement or involve a complex series of operations in a controlled environment. With some of the systems it is even necessary to switch off the wire bonder during the measurement process.

For example, U.S. Pat. No. 5,199,630 measures the transducer's vibration amplitude by using an opto-electronic receiver and a corresponding electronic controller. To perform the measurement, the apparatus must be re-calibrated every time and thus cannot perform real-time measurement. To measure the transducer's vibration, the apparatus must be fixed to the bonding area of the wire bonder. The apparatus needs to be removed from the bonder after measurement for normal operation of the wire bonder. Hence, the apparatus can not be used to measure the oscillation amplitude during an actual wire bonding operation. Therefore, this apparatus is not practical to conduct frequent amplitude measurements.

This apparatus is also sensitive to the ambient temperature during the measurement process as it measures only the optical power variation due to the vibration of the transducer. Therefore, this apparatus is not convenient to use in an industrial environment where the temperatures in the vicinity of the capillary tip can be high due to the bonding operation.

Furthermore, the apparatus disclosed in U.S. Pat. No. 5,199,630 measures the oscillation amplitude of the ultrasonic transducer that holds the capillary tip, not the vibration amplitude of the actual capillary tip. When one capillary is replaced with a new capillary, for example due to wear of the capillary or a different capillary is needed to bond a new device, the actual vibration of the capillary may be different.

Therefore, the measurement of the oscillation amplitude of the transducer cannot be used to precisely monitor the quality of the bond, as the oscillation amplitude measured does not accurately reflect the oscillation amplitude of the capillary tip.

In accordance with a first aspect of the present invention, apparatus for detecting the oscillation amplitude of an oscillating object comprises an optical radiation source; a detector comprising first and second optical radiation sensing areas adjacent each other, the detector and the optical radiation source adapted to be located opposite each other with the oscillating object located between the source and the detector so that the object blocks a portion of the sensing areas from receiving optical radiation from the source; and a processor coupled to the detector to receive first and second output signals representing the magnitude of optical radiation sensed by the first and second optical radiation sensing areas, respectively; the processor processing the first and second output signals to obtain an indication of the amplitude of oscillation of the object.

In accordance with a second aspect of the present invention, a method of detecting the oscillation amplitude of an oscillating object comprises positioning an optical radiation source and an optical radiation detector on opposite sides of the object, the detector comprising first and second optical radiation sensing areas; illuminating the object with optical radiation from the source and processing first and second output signals from the first and the second optical radiation sensing areas to determine the oscillation amplitude of the object.

The term "optical radiation" as used herein covers electromagnetic radiation in the visible, ultraviolet and infrared regions of the electromagnetic spectrum.

An advantage of the invention is that it permits the amplitude of oscillation of a capillary tip of an ultrasonic bonder to be measured without influencing the vibration of the capillary tip. This enables real-time measurement of the vibration amplitude of the capillary tip of a wire bonder and enables the transducer to be calibrated to produce consistent vibration amplitude of the capillary tip and to thereby improve the bond quality.

Preferably, the oscillating, object is a tip of an ultrasonic transducer in an ultrasonic welding machine. Typically, where the ultrasonic welding machine is a wire bonder, the tip is a capillary tip.

Typically, the processor may generate an output oscillation signal, which can be applied to the oscillating object to modify the oscillation amplitude of the object in response to the oscillation amplitude detected by the processor. This has the advantage that as well as measuring the oscillation amplitude, the apparatus may also control the oscillation amplitude in response to the measured oscillation amplitude.

Preferably, the output oscillation signal is input to a control device that controls oscillation of the object. Typically, where the oscillating object is a tip of an ultrasonic transducer, the control device comprises an ultrasonic wave controller.

Typically, the control device compares the oscillation amplitude with a reference oscillation amplitude and controls the oscillation of the object so that the object oscillates at substantially the reference oscillation amplitude. Preferably, the control device controls the oscillation amplitude in real time.

Typically, the optical radiation source comprises a collimating device to collimate the optical radiation exiting the source.

Preferably, the width of each of the first and second optical radiation sensing areas is greater than the sum of half the width of the oscillating object and the amplitude of oscillation of the object. Typically, the amplitude of oscillation is less than the width of the oscillating object.

In one example of the invention, the first and second optical radiation sensing areas are directed towards the optical radiation source. Typically, the first and second optical radiation sensing areas are adjacent each other. The optical radiation sensing areas may be coplanar. Typically, the spacing between the first and second radiation sensing areas is not greater than 10% of the width of the oscillating object. Preferably, the spacing is less than 10% and is kept to minimum.

In an alternative example of the invention, the first and second optical radiation sensing areas are not directed towards the optical radiation source and the detector further comprises an optical device to direct the optical radiation onto the first and second sensing areas.

Preferably, the processor generates an indication of the oscillation amplitude by comparing the sum of the first and second output signals with the difference between the first and second output signals.

Typically, the first and second optical radiation sensing areas each comprise a photodiode.

BRIEF DESCRIPTION OF DRAWINGS

An example of apparatus for measuring the oscillation amplitude of an oscillating object in accordance with the invention will now be described with reference to the accompanying drawings, in which:

FIGS. 7A, 7B and 7C are schematic diagrams showing a capillary bonding tip in a central position, a left hand position and a right side position, respectively, with respect to the detector shown in FIG. 4;

FIG. 1 shows an ultrasonic transducer 1 having a capillary 2 with a tip 3. In FIG. 1 the capillary 2 is shown in a larger scale relative to the transducer 1 for clarity and to show the shape of the capillary 2. The capillary 2 is located within a hole 4 in the end of the transducer 1 so that the longitudinal axis of the capillary 2 is at approximately right angles to the longitudinal axis of the transducer 1. The capillary 2 is removably inserted into the hole 4 and held in the hole 4, for example by means of a locking screw (not shown).

The transducer 1 and capillary 2 form part of a bond head of a wire bonder for bonding conductive wire to semiconductor dies and leadframes. The wire to be bonded passes through a through bore 5 in the capillary 2, which is coincident with the longitudinal axis 6, and extends out of the tip 3. FIG. 1 also shows a sensor head 7 comprising a body 8 on which is mounted an optical radiation emitter 9 and an optical radiation detector 10.

Figure 1:
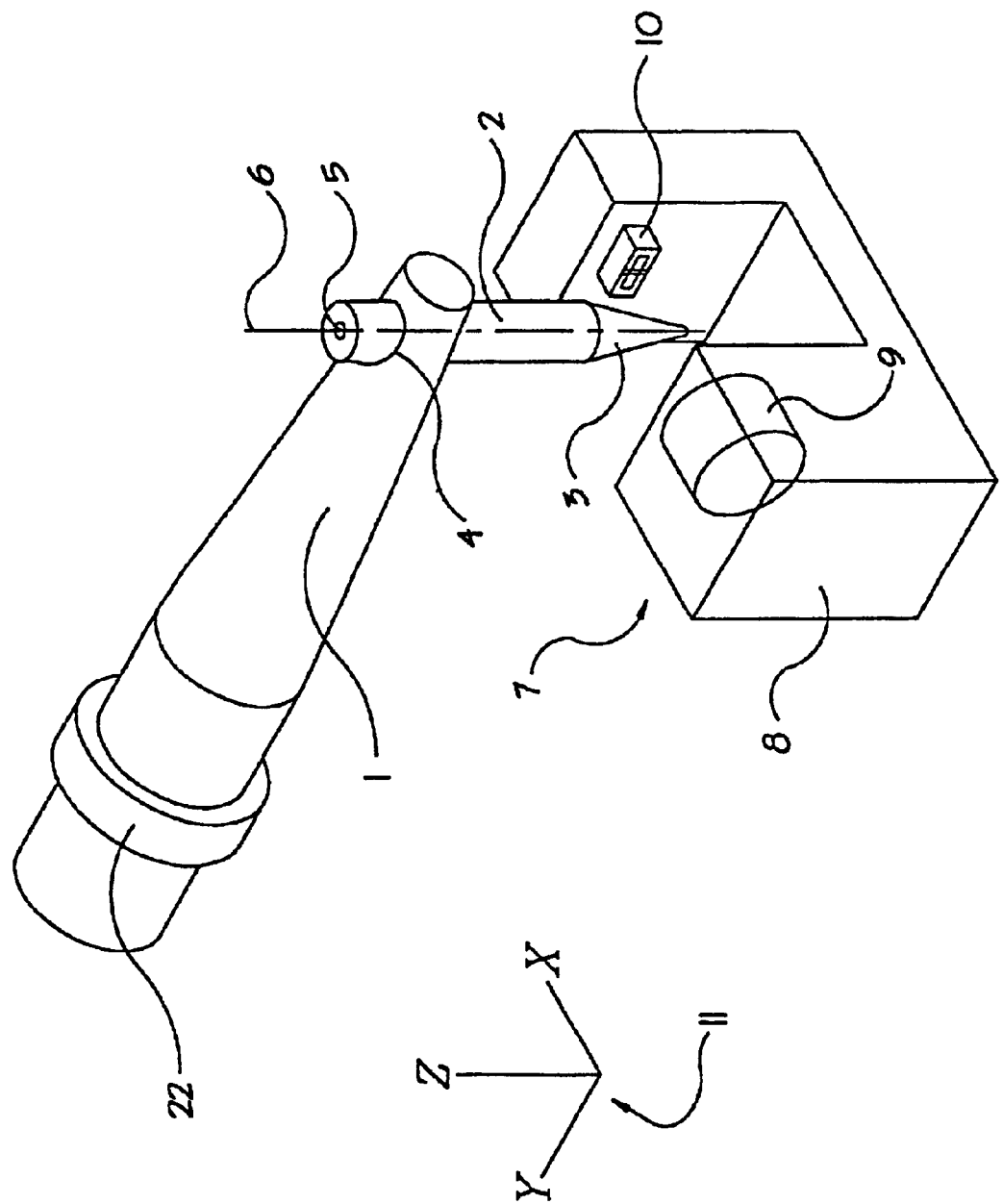
FIG. 1 is a perspective view of an ultrasonic transducer and an optical radiation source and detector.

Also shown in FIG. 1, for reference purposes only, is a set of X-Y-Z co-ordinates 11. In use, during wire bonding (i.e. during ultrasonic welding of wire at the capillary tip 3 to a semiconductor die or a leadframe) the transducer 1 oscillates (or vibrates) in the Y direction with respect to the sensing head 7. This vibration has been identified as being the most important vibration contribution to the bond quality. In addition, the transducer 1 and capillary 2 may be moved up and down in the Z direction, with respect to the sensing head 7, to bring the tip 3 into contact with the surface to which the wire is to be bonded.

Figure 2:
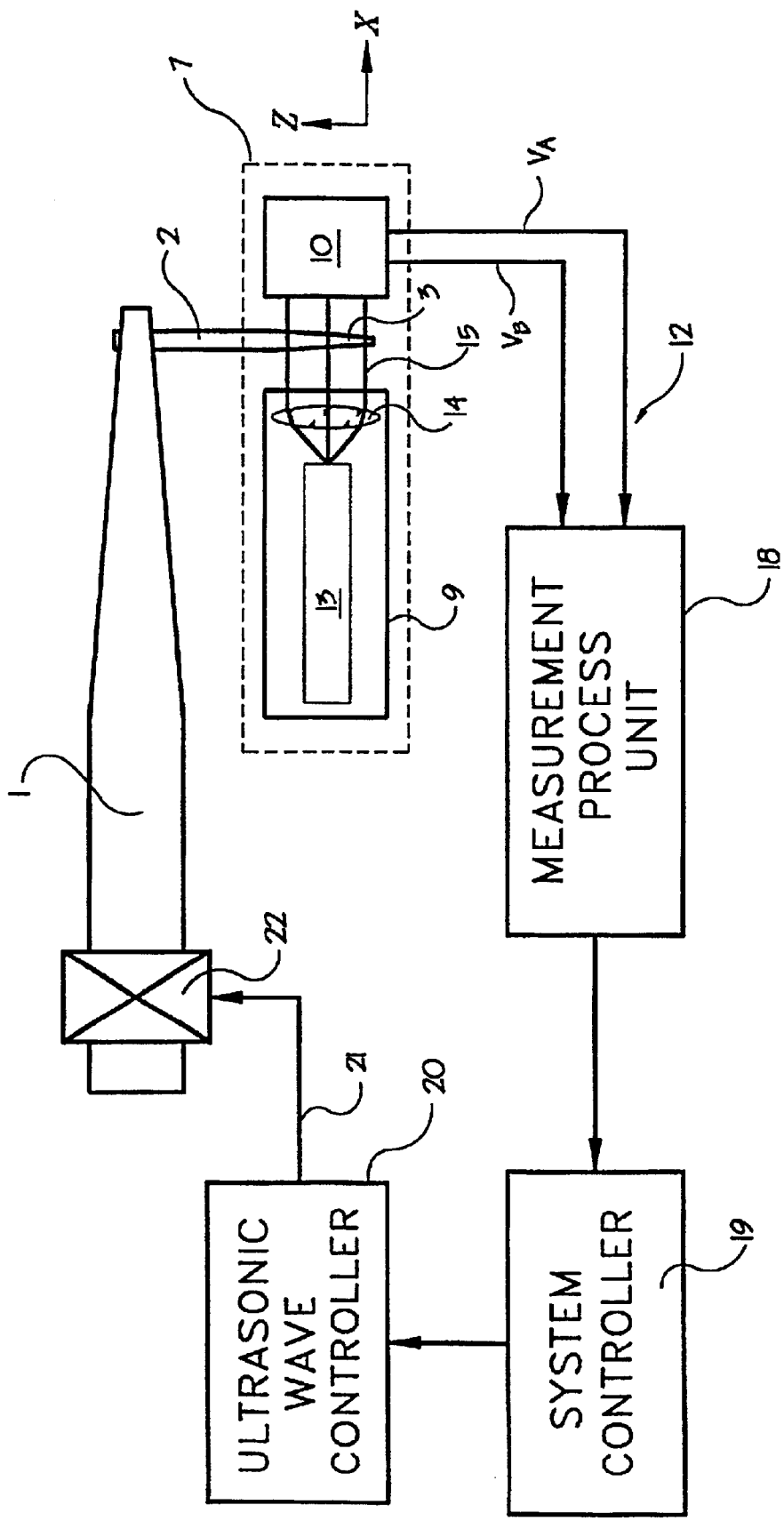
FIG. 2 is a schematic view of the transducer of FIG. 1 and oscillation measuring apparatus incorporating the source and detector shown in FIG. 1.

FIG. 2 shows oscillation measurement apparatus 12 including the sensor head 7 (shown in phantom) with the transducer 1 and capillary 2. The orientation of the sensing head 7 is as viewed in the Y direction shown in FIG. 1. Although in FIG. 2 the transducer 1 is shown with its longitudinal axis extending in the X direction, this is for the purposes of clarity only and the longitudinal axis of the transducer would extend in the Y direction in use, as shown in FIG. 1. As shown in FIG. 2, the emitter 9 comprises an optical radiation source 13 and collimating optics 14. Hence, the emitter 9 generates a collimated beam 15 of optical radiation.

The detector 10 generates a first output signal $V_A$ and a second output signal $V_B$ which are fed to a measurement process unit 18. The measurement process unit 18 is coupled to a system controller 19 which in turn is coupled to an ultrasonic wave generator 20. The ultrasonic wave controller 20 generates an output 21 that is fed to the bond head 22 to control the amplitude of oscillation of the transducer 1 and thereby control the oscillation amplitude of the tip 3.

Figure 3:
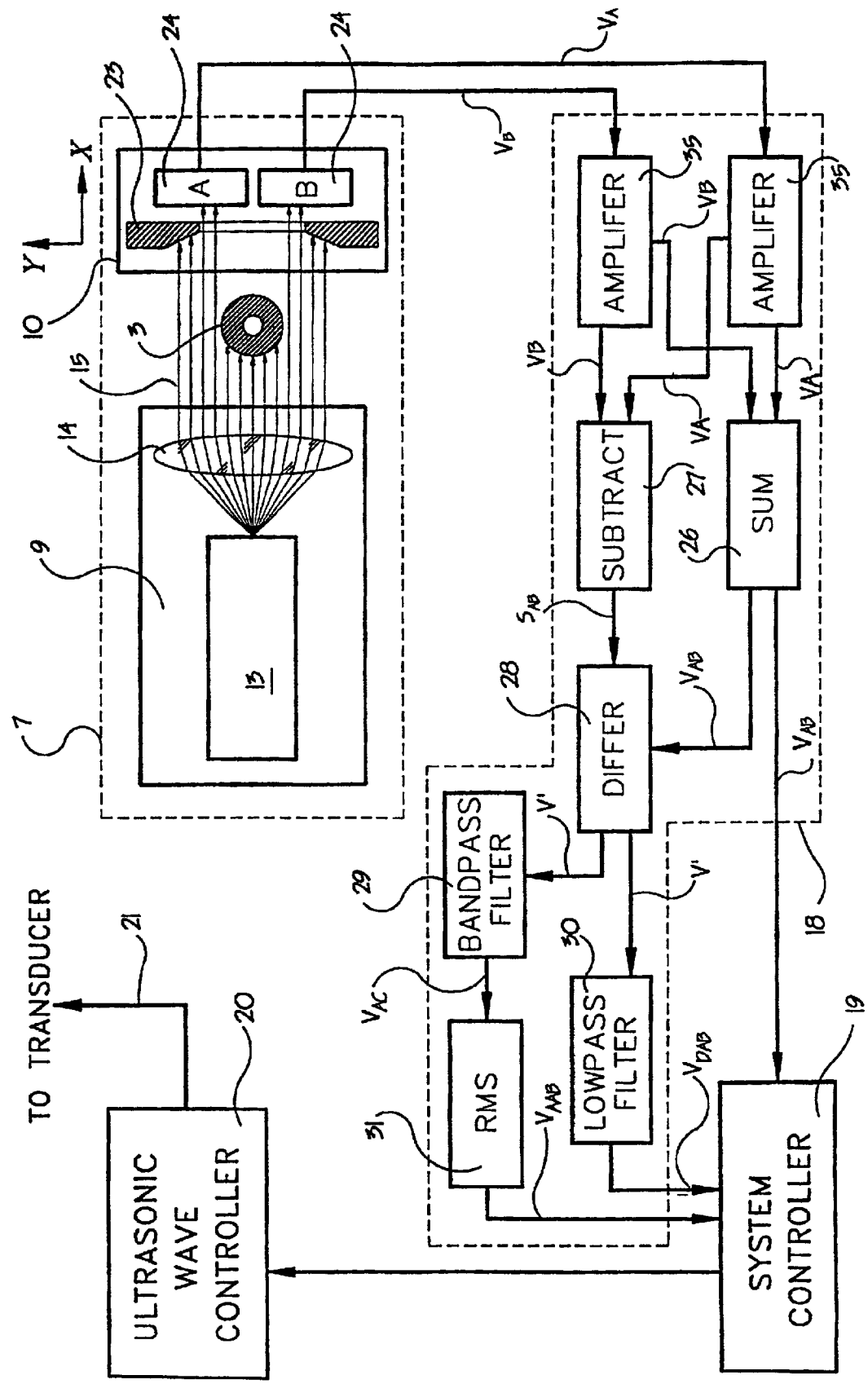
FIG. 3 is a block diagram of the apparatus shown in FIG. 2 with a measurement process unit shown in more detail.
Figure 5:
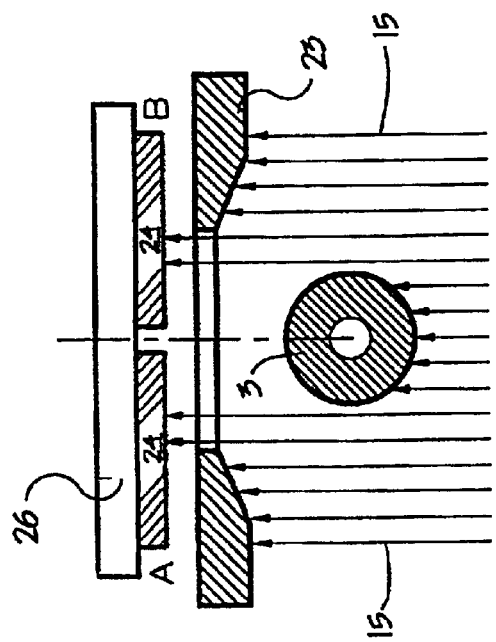
FIG. 5 is a cross-sectional view of the detector of FIG. 4 in use.

FIG. 3 shows the detector 10 and the unit 18 in more detail. In this figure, the sensing head 7 is as viewed in the Z direction of FIG. 1. The detector 10 comprises an optical aperture 23 and two photodiodes 24A, 24B located behind the optical aperture 23. FIG. 5 shows a more detailed cross-sectional view of the detector 10 and capillary tip 3. The photodiodes 24 are mounted on a support 26. The photodiodes 24A, 24B generate the first and second output signals $V_A$, $V_B$ respectively. The output signals $V_A$, $V_B$ are in the form of voltage signals whose magnitude is indicative of the magnitude of optical radiation detected by the respective photodiode 24.

The unit 18 includes two amplifiers 35. Each amplifier 35 receives one of the output signals $V_A$, $V_B$, amplifies the signal and outputs the respective amplified signal VA, VB to a summing device 26 and a subtraction device 27. The summing device 26 sums the signals VA, VB and outputs the sum $V_{AB}$ (=VA+VB) to the system controller 19 and to a difference device 28. The subtraction device 27 subtracts the signals VA, VB and outputs a signal $S_{AB}$ (which is equal to the magnitude of the subtracted signals) to the difference device 28. The difference device 28 generates an output signal V'. This is defined as follows:

$$V' = \frac{S_{AB}}{V_{AB}} = \frac{V_A - V_B}{V_A + V_B}$$

The output signal V' is output to a bandpass filter 29 and a lowpass filter 30. The signals $V_A$, $V_B$ from the photodiodes 24A, 24B typically comprise a DC component and an AC component. Hence, the output V' of the difference device 28 also includes AC and DC components. Therefore, V' can be separated into a DC component $V_{DAB}$ and an AC component $V_{AC}$. That is $V'=V_{DAB}+V_{AC}$.

The lowpass filter 30 removes the AC component and so outputs the DC component $V_{DAB}$ to the system controller 19. $V_{DAB}$ is used to position the capillary tip 3 in the Y direction and to calibrate the system during assembly.

The bandpass filter 29 removes the DC component and so outputs the AC component $V_{AC}$ to an RMS device 31 which converts the AC component $V_{AC}$ to a DC signal $V_{AAB}$ which is proportional to the amplitude of the AC component $V_{AC}$.

In general, the output current of the photodiodes 24 is proportional to the received power of the optical radiation. This is proportional to the effective sensing area, assuming uniform optical radiation intensity $I_O$ over the whole of the effective sensing area. The output current is converted to a proportional voltage signal V. For the system described herein and shown in the drawings, $V_A$ and $V_B$ are proportional to the total sensing area of the detectors 24A, 24B respectively. During measurement, the total effective sensing area stays constant. Therefore, $V_{AB}$ is proportional to the optical radiation intensity $I_O$.

$V_{AB}$ is also used as a reference signal to correctly position the capillary tip 3 with respect to the photodiodes 24A, 24B, as described below.

The system controller 19 receives the output signals from the process unit 18. Based on the parameters set in the system controller 19 and the signals received from the process unit 18, the system controller 19 calculates the necessary control parameters to drive the ultrasonic wave controller 20. In response to the control parameters received from the system controller 19, the ultrasonic wave controller 20 outputs the signal 21 to control the amplitude of oscillation of the capillary tip 3 by controlling the oscillation of the ultrasonic transducer 1.

Figure 4:
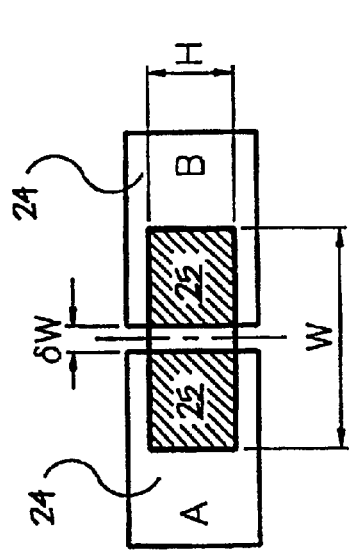
FIG. 4 is a front view of the detector shown in FIG. 1.

To measure the oscillation amplitude of the capillary tip 3, the capillary tip 3 is positioned between the emitter 9 and the detector 10, as shown in FIGS. 1 to 3. The collimated light beam 15 illuminates the capillary tip 3 and projects a shadow of the capillary tip 3 onto the detector 10. As shown in FIG. 4, the photodiodes 24A, 24B each have a net effective or active sensing area 25A, 25B. The sensing areas 25 face towards the emitter 9 so that collimated light 15 entering the aperture 23 is detected by the sensing areas 25. The aperture 23 is large enough so that the shadow image of the capillary tip 3 (see FIGS. 7A, 7B and 7C) is positioned within the aperture 23 during measurement but small enough to maintain high resolution. The collimated light beam 15 must be large enough so that part of the collimated light beam 15 passing through the aperture 23 projects an even illumination covering the combined width W of the sensing areas 25 of the photodiodes 24 and the height H of the sensing areas 25 of the photodiodes 24, as shown in FIG. 4. The width W and height H, together with the separation δW of the sensing areas 25, determine the sensitivity and measuring range of the apparatus 12. The two photodiodes 24 are placed very closely behind the aperture 23. The separation δW of the sensing areas 25 is typically of the order of 10 μm to 100 μm. The output signals $V_A$ and $V_B$ are proportional to the total optical power detected by the respective photodiode 24A, 24B, and therefore, the proportion of the light beam 15 incident on the respective sensing area 25A, 25B.

The output voltage $V_{AB}$ generated by the summing device 26 is used as a reference signal to position the capillary in the sensor head 7. Before the capillary tip 3 is positioned in the sensor head 7, the voltage $V_{AB}$ is equal to $U'_{SUM}$. A pre-defined constant β is used to determine if the capillary tip 3 is correctly aligned in the sensor head 7. When the capillary tip 3 is aligned correctly, the voltage $V_{AB}$ is equal to $U_{SUM}=\beta U'_{SUM}$ where β is a pre-defined value ranging from 0.5 to 0.8 and is dependent on the expected sensitivity and measurement range of the apparatus 12. In this way, the measurement can be made at the same section of the capillary tip 3 for the same type of capillaries.

Figure 8:
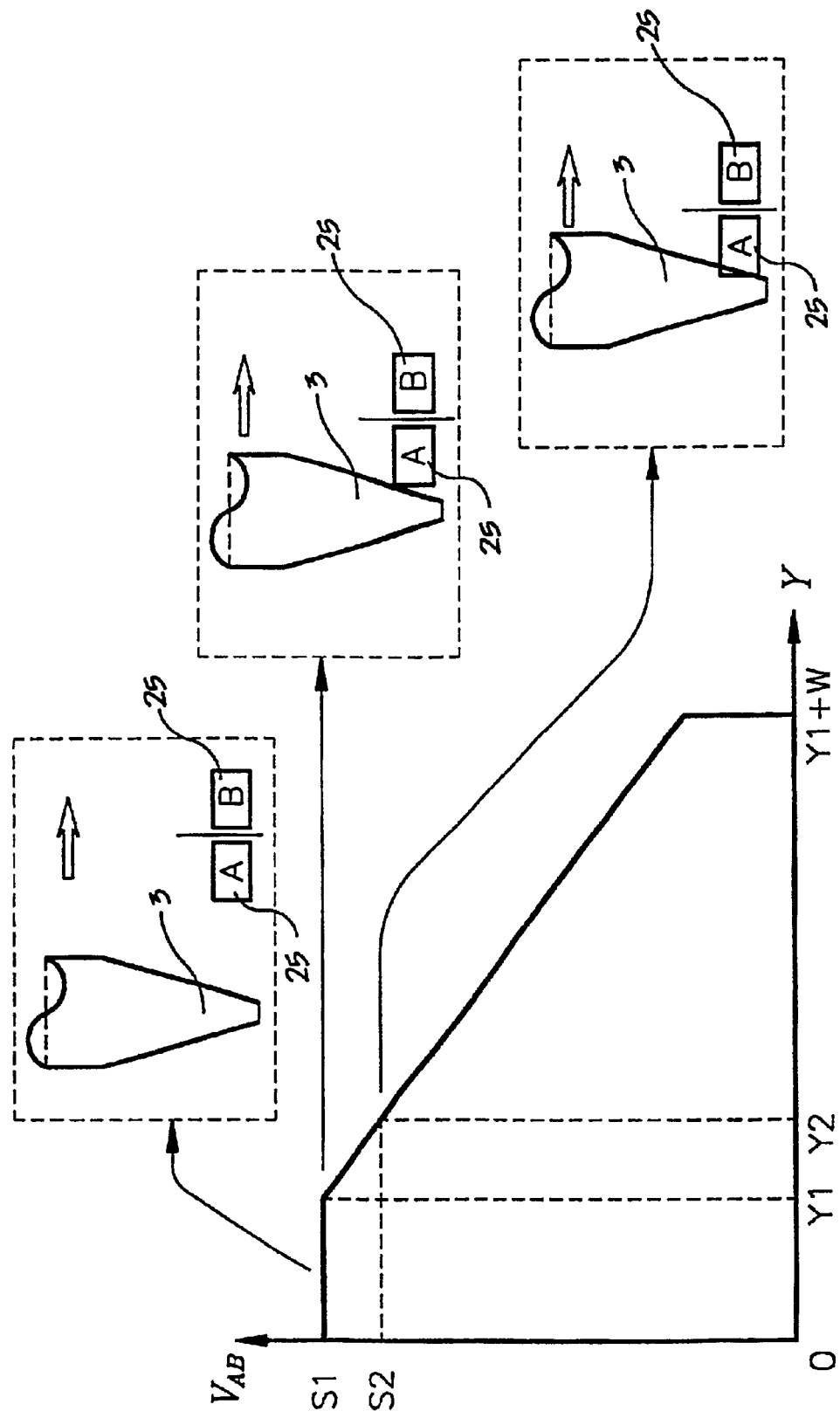
FIG. 8 is a graph of the output signal from the detector of FIG. 4 versus capillary tip position in the Y direction.

To align the tip 3 for the Y direction, firstly the voltage $V_{AB}$ is measured without the tip 3 in the sensor head 7. The tip 3 is then moved into the sensor head 7, and $V_{AB}$ is monitored by the system controller 19. When the $V_{AB}$ starts to fall which corresponds to position Y1 in FIG. 8, the capillary tip 3 is then inserted a further distance of W/2. The position of the capillary tip can be fine adjusted by using the voltage signal $V_{DAB}$. When the capillary tip is positioned correctly in the centre of the sensing areas, $V_{DAB}$ will be equal to zero or will be at a minimum value. The system controller 19 records this Y position for reference as $Y_{CENTRE}$.

Figure 9:
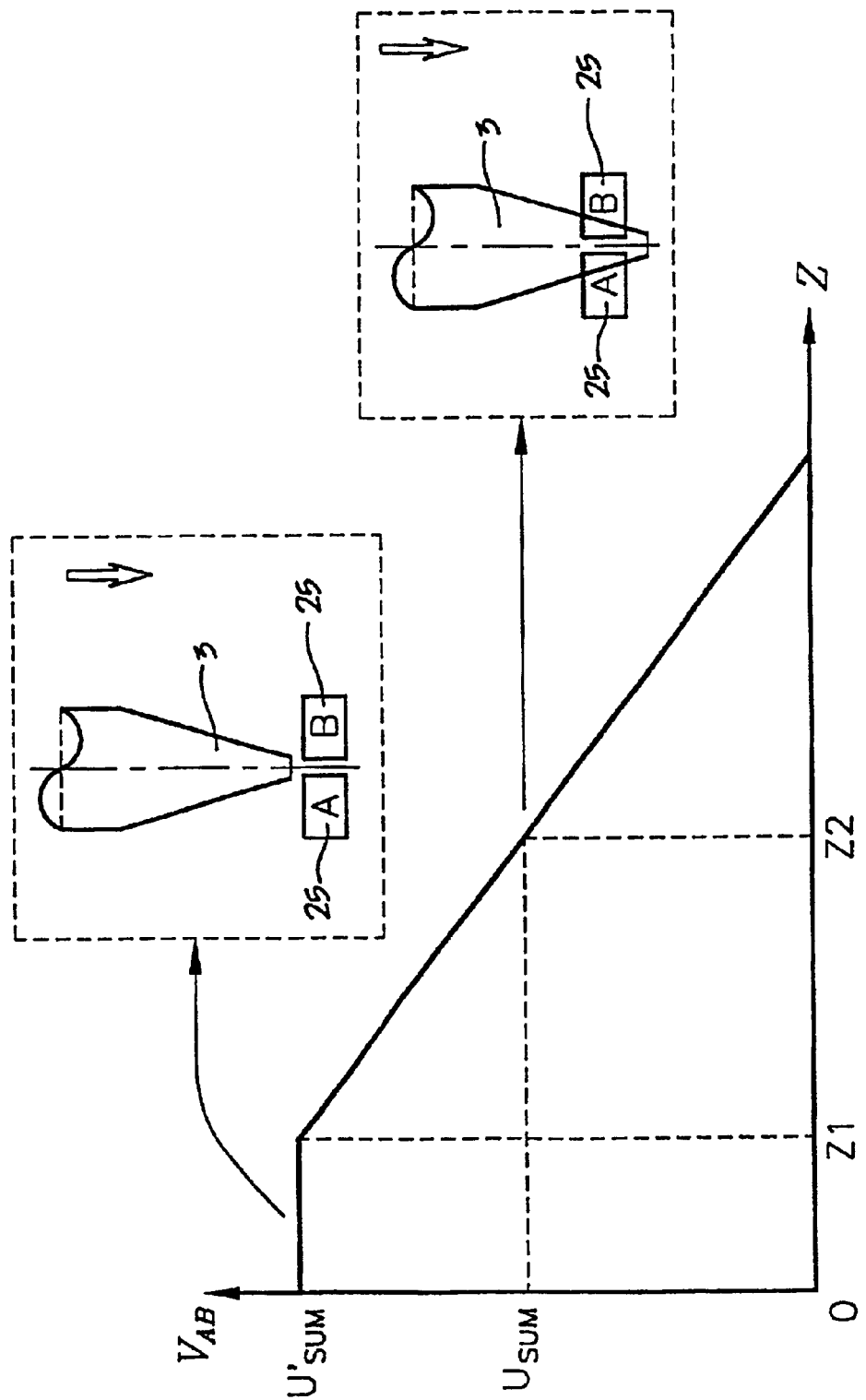
FIG. 9 is a graph of the output signal from the detector of FIG. 4 versus capillary tip position in the Z direction.

To align the tip 3 in the Z direction, firstly the voltage $V_{AB}$ is measured without the tip 3 in the sensor head 7. This is indicated as position Z1 in FIG. 9. The tip 3 is then lowered into the head 7 along the Z direction towards the centre of the sensing areas 25 according to the Y reference position $Y_{CENTRE}$ while continuously monitoring the value of $V_{AB}$. The capillary tip 3 is in the correct Z position when $V_{AB}$ is equal to $U_{SUM}$ where $U_{SUM}=\beta U'_{SUM}$. The correct Z position is shown as position Z2 in FIG. 9, where it can be seen that the tip 3 partially covers the sensing areas 25A, 25B.

The Y and Z direction alignment can be done manually or automatically. Preferably, it is performed automatically by the system controller 19 and bond header according to the parameters.

Figure 7A:
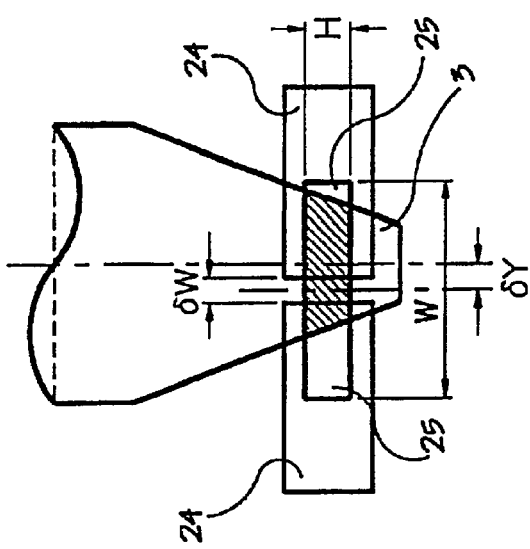
Figure 7B:
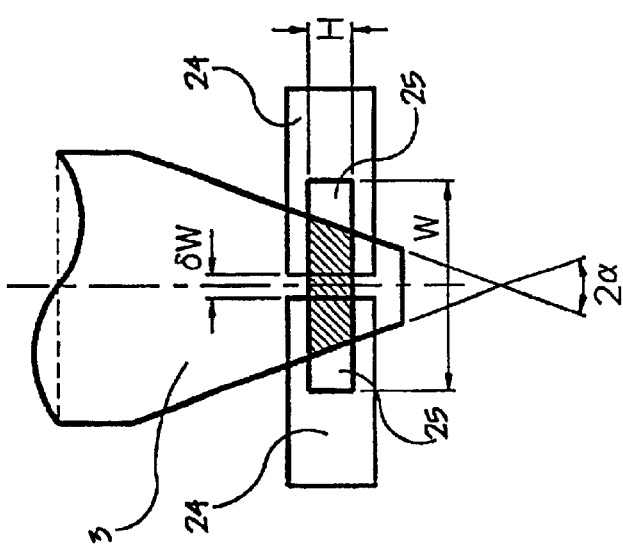
Figure 7B:
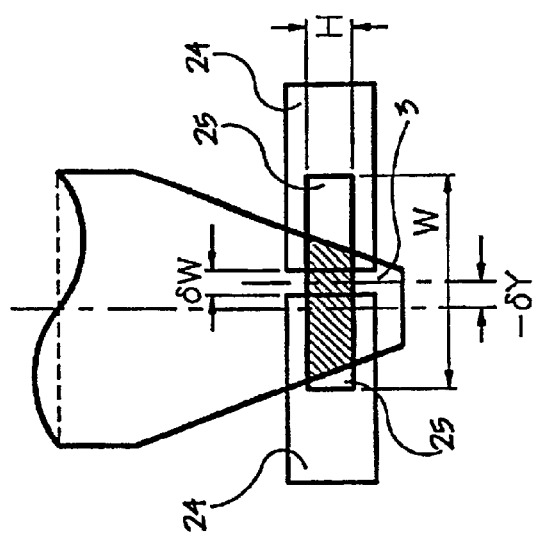

The oscillation of the capillary tip 3 is controlled by the system controller 19 via the ultrasonic wave controller 20 which drives the oscillation of the transducer 1 in response to signals received from the system controller 19. When the capillary tip 3 oscillates in the Y direction, the shadow of the tip 3 on the sensing areas 25 also moves, as shown in FIGS. 7A to 7C. In FIGS. 7A to 7C, the tip 3 has an oscillation amplitude of δY and the point of the tip 3 has an angle of 2α.

Hence, the light power detected by each photodiode changes during an oscillation cycle of the tip 3 and the corresponding output signal $V_A$, $V_B$ changes accordingly. However, the output $V_{AB}$ from the summing device 26 will remain constant.

The output signals $V_A$, $V_B$ are fed to the processing unit 18 where they are amplified by the respective amplifiers 35. The signals $V_A$, $V_B$ are processed as described above in the processing unit 18 to obtain the three output signals $V_{AB}$, $V_{DAB}$, $V_{AAB}$.

$V_{DAB}$ indicated if the capillary tip was positioned in the centre of window of sensor' receiver. $V_{AAB}$ is directly proportional to the vibration amplitude δY of capillary tip according to following equation:

$$\delta Y = \gamma_{AC} V_{AAB}$$

where $\gamma_{AC}$ is the sensitivity of the apparatus 12. The value of $\gamma_{AC}$ is calculated according to the following equation:

$$\gamma_{AC} = \beta(W - \delta W)/2M$$

where M is a constant of the processing unit 18. M is determined by the amplification of the processing unit 18. β is the pre-defined constant referred to above and is equal to $U_{SUM}/U'_{SUM}$. Therefore, the sensitivity of the apparatus 12 is dependent only on the width W and the separation δW, as M and β are both constants.

Figure 6:
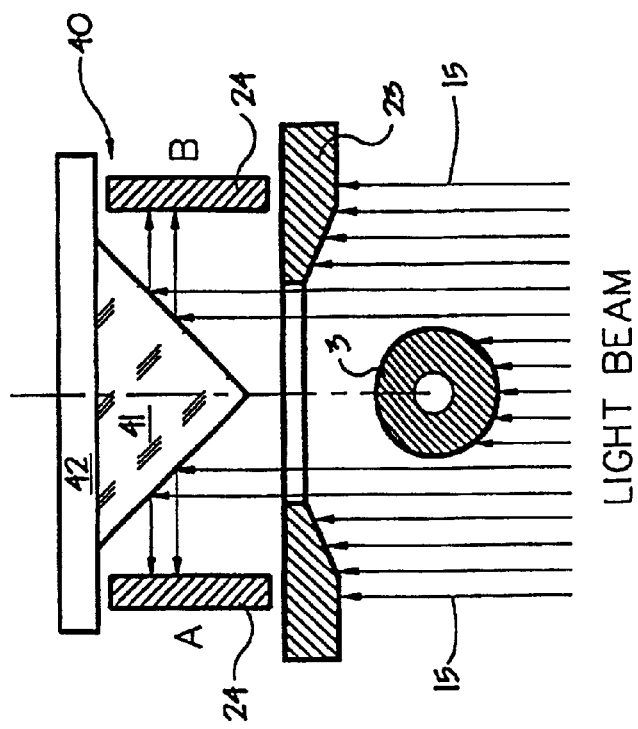
FIG. 6 is a cross-sectional view of another example of a detector in use.

An alternative example of a detector 40 is shown in FIG. 6. In this example the detector 40 includes two photodiodes 24A, 24B which face each other. The light beam 15 is reflected onto the photodiodes by a reflecting device 41 mounted on a support 42. Hence, actual detection and operation of the detector 40 is identical to that for the detector 10 except that the separation δW is nearly equal to zero.

Figure 11:
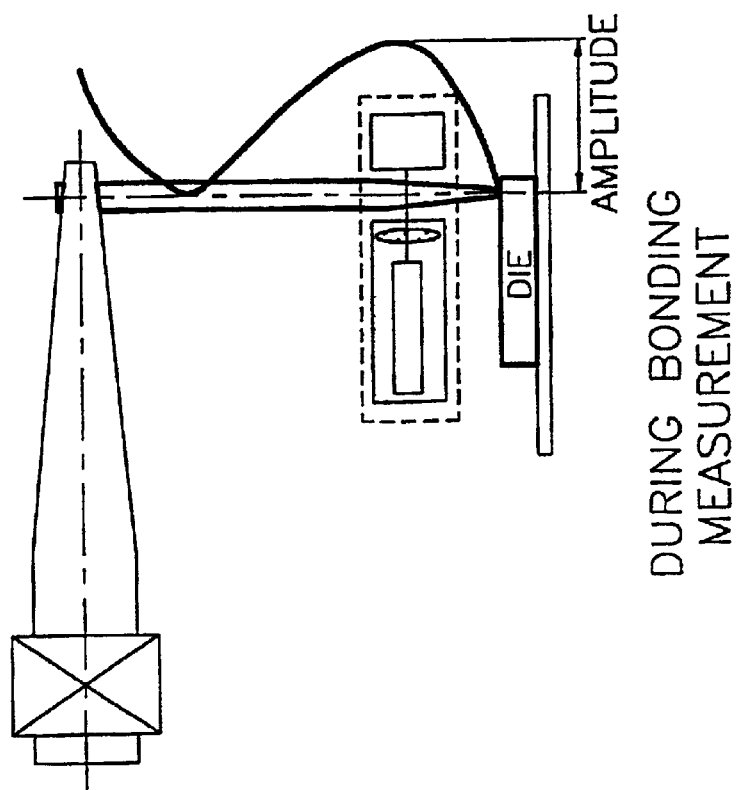
FIG. 11 shows a vibration profile of a capillary during wire bonding.
Figure 10:
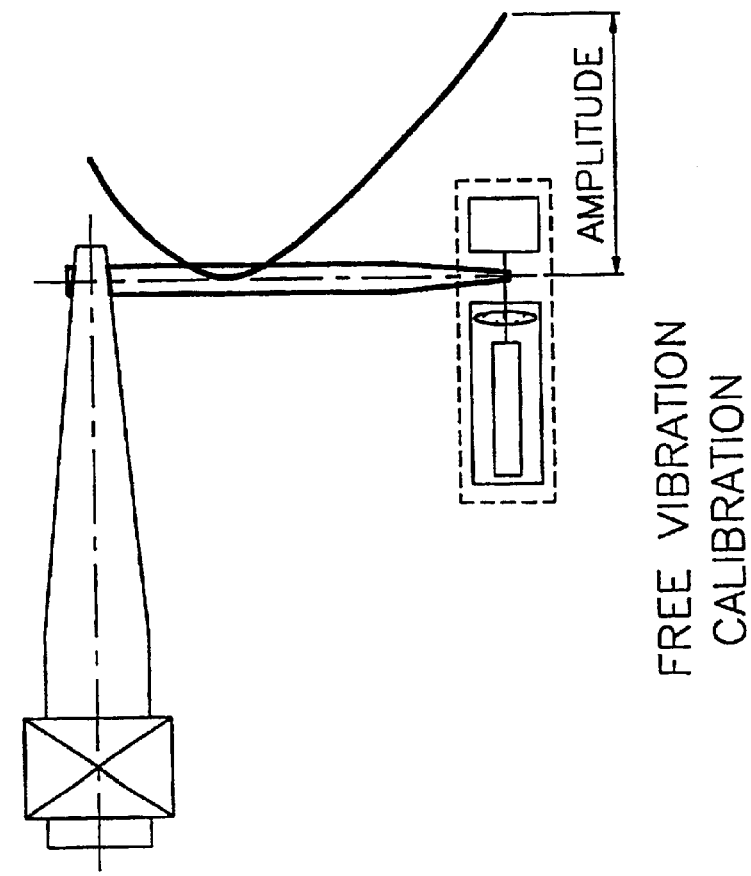
FIG. 10 shows a vibration profile of a capillary in free vibration.

By means of the feedback system obtained by coupling the processing unit 18 to the system controller 19, it is possible to adjust the oscillation amplitude of the capillary tip 3, in real time, until the amplitude is at a desired value. In addition, due to the compact nature of the sensor head 7 it is possible to measure the oscillation amplitude of the tip 3 at any time during operation of the wire bonder, including during an actual wire bond operation. This is important as the oscillation (or vibration) profile of the tip 3 is different depending on whether the tip 3 is in free vibration (i.e. not contacting a bonding surface) or performing a wire bond operation, as shown in FIGS. 10 and 11, respectively. Therefore, this enables optimisation of the oscillation amplitude and a more consistent bonding process with a reduction in the number of faulty bonds.

Other advantages of the invention are that it mitigates the effect of temperature fluctuations and does not require re-calibration before each measurement. In addition, as the measurement process can be performed during the wire bond operation it is not necessary to stop or switch off the bonder to perform the measurement. This reduces the downtime of the wire bonder.

What is claimed is:

1. Apparatus for detecting the oscillation amplitude of an oscillating object, the apparatus comprising:

an optical radiation source;

a detector oriented for receiving optical radiation from said optical radiation source, said detector comprising first and second optical radiation sensors adjacent each other and both receiving said optical radiation from said optical radiation source, the detector and the optical radiation source being adapted to be located on opposite sides of the oscillating object from each other, with the oscillating object located between the source and the detector so that when so located, the object blocks a portion of the optical radiation directed toward said detector from the source; and a processor coupled to the detector to receive first and second output signals generated respectively by the first and second sensors and representing the magnitude of optical radiation sensed by the first and second optical radiation sensors, respectively;

wherein the processor processes the first and second output signals to obtain an indication of the amplitude of oscillation of the object;

wherein said oscillating object is an ultrasonic transducer; and wherein the width of each of the first and second optical radiation sensors is greater than the sum of half the width of the oscillating object and the amplitude of oscillation of the object.

2. Apparatus according to claim 1, wherein the processor generates an output oscillation signal that is applied to the oscillating object to modify the oscillation amplitude of the object in response to the oscillation amplitude indicated by the processor.

3. Apparatus according to claim 2, wherein the output oscillation signal is input to a control device that controls oscillation of the object.

4. Apparatus according to claim 3, wherein the control device compares the oscillation amplitude with a reference value and controls the oscillation of the object so that the object oscillates at an amplitude substantially equal to the reference value.

5. Apparatus according to claim 3, wherein the oscillation amplitude is controlled in real time.

6. Apparatus according to claim 1, wherein the first and second optical radiation sensors are directed towards the optical radiation source.

7. Apparatus according to claim 1, wherein the first and second optical radiation sensors are not directed towards the optical radiation source and the detector further comprises an optical device to direct the optical radiation onto the first and second sensors.

8. Apparatus according to claim 6, wherein the first and second optical radiation sensors are adjacent each other.

9. Apparatus according to claim 1, wherein the oscillating object is a tip of an ultrasonic transducer for use in an ultrasonic welding machine.

10. A wire bonder comprising apparatus according to claim 1.

11. Apparatus according to claim 3, wherein the control device comprises an ultrasonic wave controller.

12. A method of detecting the oscillation amplitude of an oscillating object, said oscillating object being an ultrasonic transducer, the method comprising the steps of:

positioning an optical radiation source and an optical radiation detector on opposite sides of the object, the detector being oriented for receiving optical radiation from said optical radiation source, the detector comprising first and second optical radiation sensors adjacent each other and both receiving said optical radiation from said optical radiation source, the oscillating object being located between the source and the detector so that the object blocks a portion of the optical radiation directed toward said detector from said source;

illuminating the object and the detector with optical radiation from the source; and processing first and second output signals generating respectively by the first and the second optical radiation sensors to determine the oscillation amplitude of the object.

13. A method according to claim 12, wherein the first and second output signals are processed by comparing the sum of the first and second output signals with the difference between the first and second output signals.

14. A method according to claim 12, wherein the oscillating object is a tip of an ultrasonic transducer in an ultrasonic welding machine.

15. A method according to claim 12, further comprising controlling the oscillation amplitude of the oscillating object in response to the determined oscillation amplitude.

16. A method according to claim 15, wherein the oscillation amplitude is controlled by comparing the determined oscillation amplitude with a reference value and controlling the oscillation of the object to oscillate at an amplitude substantially equal to the reference value.

17. A method according to claim 15, wherein the oscillation amplitude is controlled in real time.

18. Apparatus according to claim 1, wherein said optical radiation sensors receive said optical radiation directly from said optical radiation source.

19. Apparatus according to claim 15, wherein said detector is oriented facing said optical radiation source.

20. Apparatus according to claim 1, wherein said detector is oriented facing said optical radiation source.

21. A method according to claim 12, wherein said optical radiation sensors receive said optical radiation directly from said optical radiation source.

22. A method according to claim 21, wherein said detector is oriented facing said optical radiation source.

23. A method according to claim 12, wherein said detector is oriented facing said optical radiation source.

24. Apparatus according to claim 1, wherein the oscillating object is a tip of an ultrasonic transducer for use in a wire bonder.

25. An ultrasonic welding machine comprising apparatus according to claim 1.

26. A method according to claim 12, wherein the oscillating object is a tip of an ultrasonic transducer in a wire bonder.

27. A method according to 12, wherein the width of each of the first and second optical radiation sensors is greater than the sum of half the width of the oscillating object and the amplitude of oscillation of the object.

* * * * *